(12) United States Patent
Leobandung

(10) Patent No.: US 9,276,115 B2
(45) Date of Patent: Mar. 1, 2016

(54) SEMICONDUCTOR DEVICES AND METHODS OF MANUFACTURE

(71) Applicant: INTERNATIONAL BUSINESS MACHINES CORPORATION, Armonk, NY (US)

(72) Inventor: Effendi Leobandung, Stormville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 14 days.

(21) Appl. No.: 14/013,734

(22) Filed: Aug. 29, 2013

(65) Prior Publication Data

US 2015/0064892 A1 Mar. 5, 2015

(51) Int. Cl.
- *H01L 21/8238* (2006.01)
- *H01L 29/78* (2006.01)
- *H01L 21/28* (2006.01)
- *H01L 21/8234* (2006.01)
- *H01L 29/66* (2006.01)
- *H01L 27/088* (2006.01)

(52) U.S. Cl.
CPC ........ *H01L 29/785* (2013.01); *H01L 21/28008* (2013.01); *H01L 21/823431* (2013.01); *H01L 27/0886* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 4,957,881 A | 9/1990 | Grotti | |
| 5,283,203 A | 2/1994 | Gill et al. | |
| 6,261,924 B1 | 7/2001 | Mandelman et al. | |
| 8,253,211 B2 | 8/2012 | Cheng et al. | |
| 8,274,097 B2 | 9/2012 | Cheng | |
| 8,492,228 B1 | 7/2013 | Leobandung et al. | |
| 2009/0176368 A1 | 7/2009 | Wu et al. | |
| 2011/0291188 A1* | 12/2011 | Cheng et al. | 257/347 |
| 2012/0313170 A1* | 12/2012 | Chang et al. | 257/347 |
| 2013/0062669 A1* | 3/2013 | Chen et al. | 257/288 |
| 2014/0231048 A1* | 8/2014 | De Vos et al. | 165/61 |

OTHER PUBLICATIONS

Office Action for related U.S. Appl. No. 14/024,116 dated Jun. 27, 2014, 7 pages.
Yeh, J.L., "Reverse Pillar and Maskless Contact . . ." Jun. 13-14, VLSI Multilevel Interconnection Conference, 1988. Proceedings., Fifth International IEEE . Abstract only.

(Continued)

*Primary Examiner* — Pamela E Perkins
(74) *Attorney, Agent, or Firm* — Anthony Canale; Andrew M. Calderon; Roberts Mlotkowski Safran & Cole, P.C.

(57) ABSTRACT

Semiconductor devices with reduced substrate defects and methods of manufacture are disclosed. The method includes forming at least one gate structure over a plurality of fin structures. The method further includes removing dielectric material adjacent to the at least one gate structure using a maskless process, thereby exposing an underlying epitaxial layer formed adjacent to the at least one gate structure. The method further includes depositing metal material on the exposed underlying epitaxial layer to form contact metal in electrical contact with source and drain regions, adjacent to the at least one gate structure. The method further includes forming active areas and device isolation after the formation of the contact metal, including the at least one gate structure. The active areas and the contact metal are self-aligned with each other in a direction parallel to the at least one gate structure.

21 Claims, 7 Drawing Sheets

(56) References Cited

OTHER PUBLICATIONS

Office Action for related U.S. Appl. No. 14/024,116 dated Feb. 20, 2015, 9 pages.

Office Action for related U.S. Appl. No. 14/024,116 dated Sep. 2, 2015, 10 pages.

Notice of Allowance dated Dec. 17, 2015 in related U.S. Appl. No. 14/024,116, 17 Pages.

* cited by examiner

SEMICONDUCTOR DEVICES AND METHODS OF MANUFACTURE

FIELD OF THE INVENTION

The invention relates to semiconductor structures and, more particularly, to semiconductor devices and methods of manufacture.

BACKGROUND

Semiconductor manufacturing consists of a complex set of processes. These processes include three main building blocks: (i) deposition of thin films of material on a substrate, (ii) applying a patterned mask on top of the films by photolithographic imaging, and (iii) etching the films selectively to the mask. These three main building blocks must be rigorously calibrated and monitored to maintain device yield.

The manufacture of semiconductor devices can vary depending on the devices or structures being manufactured. Some of these manufacturing processes can be very time consuming and expensive. For example, conventional semiconductor fabrication processes can include the need for multiple masking steps, which leads to manufacturing complexity and costs. These masking steps can be used to manufacture transistors, as well as other devices and structures. Even in alternative methods, such as maskless self-aligned processes, masks are still required to remove contacts, etc. These self-aligned processes also suffer significant density loss, which will considerably impact device yield.

Accordingly, there exists a need in the art to overcome the deficiencies and limitations described hereinabove.

SUMMARY

In a first aspect of the invention, a method comprises forming at least one gate structure over a plurality of fin structures. The method further comprises removing dielectric material adjacent to the at least one gate structure using a maskless process, thereby exposing an underlying epitaxial layer formed adjacent to the at least one gate structure. The method further comprises depositing metal material on the exposed underlying epitaxial layer to form contact metal in electrical contact with source and drain regions, adjacent to the at least one gate structure. The method further comprises forming active areas and device isolation after the formation of the contact metal, including the at least one gate structure. The active areas and the contact metal are self-aligned with each other in a direction parallel to the at least one gate structure.

In another aspect of the invention, a method comprises forming at least one replacement gate structure extending over a plurality of fin structures and surrounded by dielectric material. The method further comprises removing the dielectric material using a maskless process, thereby exposing an underlying epitaxial layer formed adjacent to the at least one replacement gate structure. The method further comprises depositing metal material on the exposed underlying epitaxial layer, adjacent to the at least one replacement gate structure. The method further comprises forming active areas comprising the at least one replacement gate structure. The method further comprises forming contact studs contacting the metal material and electrically connected to source and drain regions of the least one replacement gate structure.

In yet another aspect of the invention, a plurality of Si fins on a buried oxide layer; a plurality of replacement metal gate structures extending over the plurality of Si fins and buried oxide, positioned orthogonal to the plurality of Si fins, the plurality of replacement metal gate structures comprising a gate dielectric, a metal gate and a nitride capping material, with nitride sidewall spacers; a doped Si epitaxial material adjacent to the nitride sidewall spacers and on the plurality of Si fins; a metal material adjacent to the plurality of replacement metal gate structures and on the doped epitaxial material, the metal material being planar with the capping material; insulator material on the metal material and the capping material; and contact studs in the insulator material and extending to the metal material to be in electrical contact with source and drain regions of the plurality of replacement metal gate structures.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the semiconductor structures, which comprises the structures of the present invention. In still further embodiments, a method in a computer-aided design system is provided for generating a functional design model of the semiconductor structures. The method comprises generating a functional representation of the structural elements of the semiconductor structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 1, 2a, 2b, 3-5a, 5b, 6-10a and 10b show fabrication processes and respective structures in accordance with aspects of the present invention.

DETAILED DESCRIPTION

The invention relates to semiconductor structures and, more particularly, to semiconductor devices and methods of manufacture. In more specific embodiments, the present invention utilizes a manufacture process which eliminates several conventional masking steps. In particular, the present invention utilizes a maskless contact process that is self-aligned to both the gate and active area. That is, the present invention combines a maskless contact with device active area patterning. In this way, the manufacturing process becomes more efficient, e.g., reducing the need for certain masking steps, while improving device density and decreasing manufacturing costs. The methods of manufacturing in accordance with the present invention can be used to manufacture different devices and/or structures such as, for example, 3-D devices, e.g., FINFETs, nanowires and trigate devices.

Figure 1:
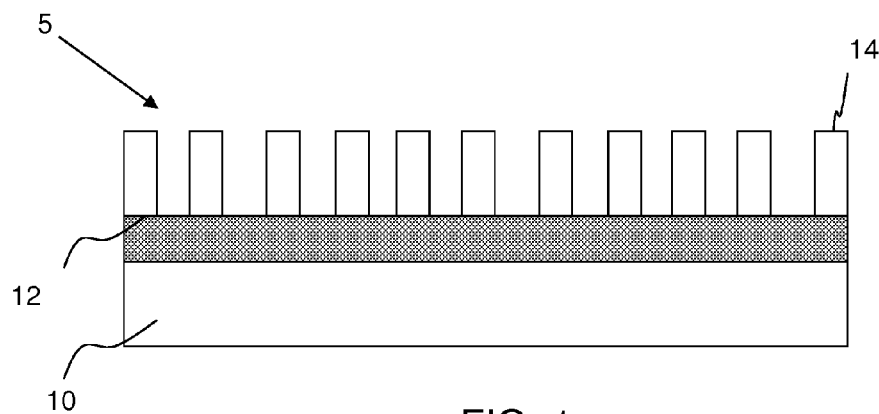

FIG. 1 shows fabrication processes and a respective structure in accordance with aspects of the present invention. In embodiments, the structure 5 of FIG. 1 can begin as a 3D device, bulk wafer or silicon on insulator (SOI) substrate formed in a conventional manner, e.g., SiMOX or bonding techniques. In particular, the structure 5 of FIG. 1 includes a substrate 10. The substrate 10 can be, for example, a Si wafer; although other semiconductor materials are also contemplated by the present invention. In embodiments, the substrate 10 can be, for example, a P—Si wafer. A dielectric layer 12 (insulator layer) can be formed on the substrate 10. The dielectric layer 12 can be an oxide material (buried oxide layer, e.g., BOX) formed using any conventionally known deposition method, such as, for example, a bonding technique.

A semiconductor material is formed on the dielectric layer 12, and patterned into fins 14. In embodiments, the fins 14 can be capped with a thin oxide (about 2 nm) such as grown or CVD oxide. In embodiments, the fins 14 can be manufactured using any conventional patterning technique. These techniques, for example, include conventional lithography and etching processes or sidewall image transfer (SIT) techniques, well known to those of skill in the art. In embodiments, the particular patterning process can be based on the required fin dimensions, as should be understood by those of skill in the art. In embodiments, the fin height can be about 30 nm and the fin width can be about 10 nm; although other dimensions are also contemplated by the present invention.

Figure 2A:
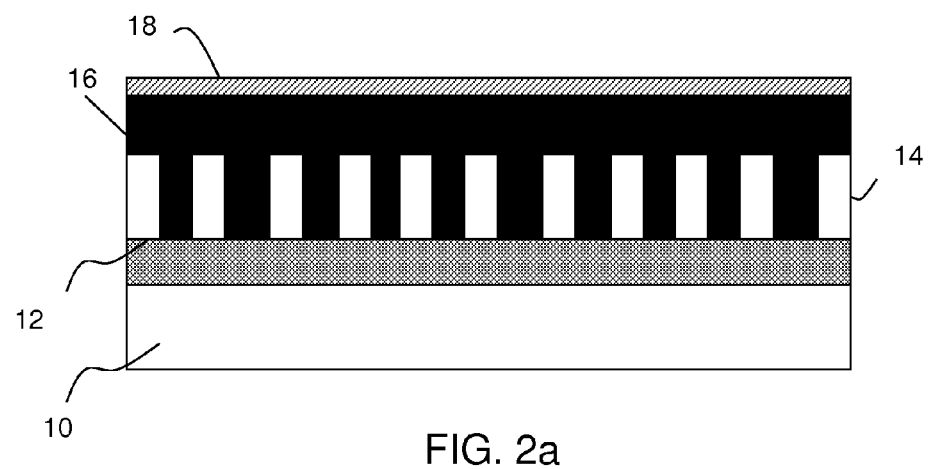
Figure 2B:
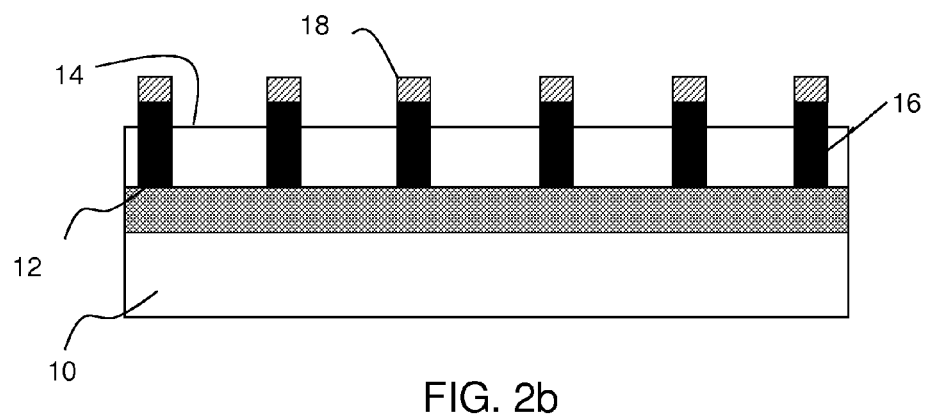

FIGS. 2a and 2b show different cross-sectional views of a structure and respective manufacturing processes, in accordance with aspects of the present invention. In particular, dummy structures 16 are formed on the dielectric layer 12 and over the fins 14, in an orthogonal orientation. That is, in embodiments, the dummy structures 16 are formed over the fins 14, extending in an orthogonal orientation to the fins 14. In embodiments, the dummy structures 16 can be formed of sacrificial material such as polysilicon. The dimensions of the dummy structures 16 can vary, depending on design criteria. By way of example, the dummy structures 16 can have a length of about 20 nm, a height of about 40 nm and a spacing therebetween of about 50 nm; although other dimensions are also contemplated by the present invention. In embodiments, a hardmask 18, e.g., nitride, is formed on an upper surface of each of the dummy structures 16.

The dummy structures 16 and hardmask 18 can be formed using conventional deposition, lithography and etching processes. By way of example, a polysilicon material can be blanket deposited on the dielectric layer 12 and over the fins 14 using a chemical vapor deposition (CVD) process. The hardmask material can then be blanket deposited on the polysilicon material using a CVD process. A resist can be formed on the hardmask material, which is patterned by exposure to energy (light). A reactive ion etching (RIE) is performed through the pattern to form the array of dummy structures 16 with a cap material, e.g., hardmask 18, thereon. The resist can then be stripped or removed using conventional stripping processes, such as oxygen ashing processes.

Figure 3:
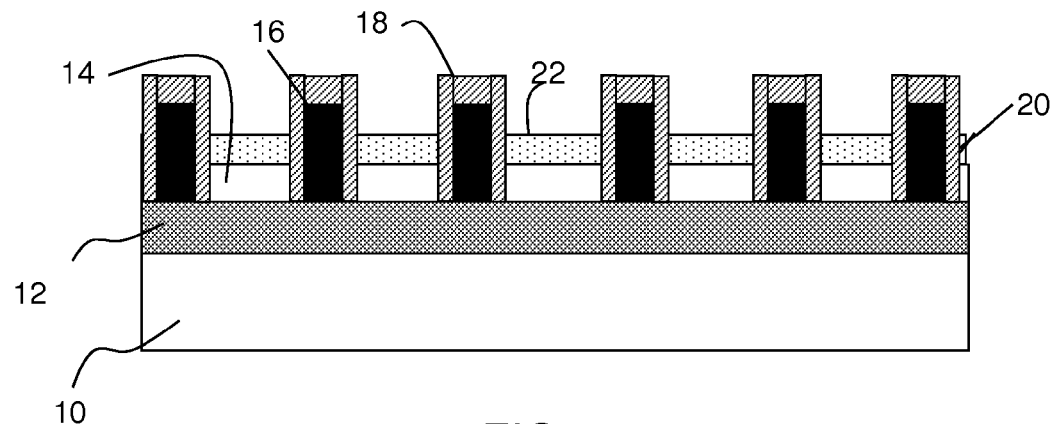

In FIG. 3, sidewall spacers 20 are formed on the sidewalls of the dummy structures 16. In embodiments, the spacers 20 are nitride or oxide material, e.g., $SiO_2$. The sidewall spacers 20 can be formed by depositing a spacer material on all surfaces of the dummy structures 16 (and on the hardmask 16) and any exposed portions of the fins 14 and underlying dielectric layer 12, using a blanket deposition process. The spacer material then undergoes a patterning process to remove excess material from horizontal surfaces, e.g., top surfaces of the hardmask 18, fins 14 and dielectric layer 12. In embodiments, the patterning step is an anisotropic or vertical etching step, which leaves the spacer material on vertical surfaces, e.g., sidewalls, of the dummy structures 16. In an illustrative example, the spacer material can extend to a top surface of the hardmask 16. The spacers 20 can have a dimension, e.g., thickness, of about 5 nm; although other dimensions are also contemplated by the present invention.

FIG. 3 also shows the formation of a Si epitaxial layer 22. In embodiments, the epitaxial layer 22 is formed in a growth process, over exposed portions of the fins 14. In embodiments, the epitaxial layer 22 has a thickness of about 20 nm; although other dimensions are also contemplated by the present invention. In any conventional manner, the epitaxial layer 22 can be doped to form source and drain regions, as should be understood by those of skill in the art.

Figure 4:
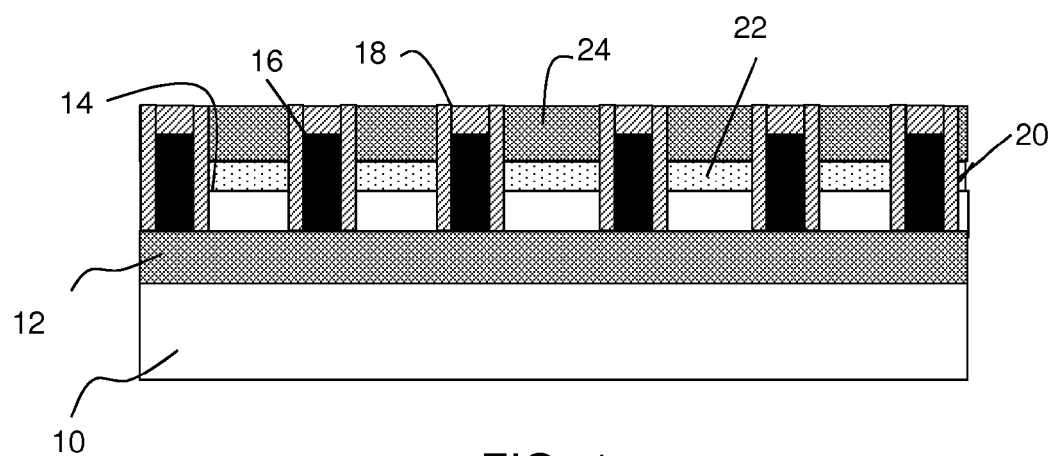

In FIG. 4, a dielectric layer (insulator layer) 24 is deposited on the exposed surfaces of the structure shown in FIG. 3. The dielectric layer 24 can be an oxide material, blanket deposited using a conventional CVD process. In embodiments, the dielectric layer 24 is then planarized to the surface of the hardmask 18. The planarization process can be a chemical mechanical polishing (CMP) process.

Figure 5A:
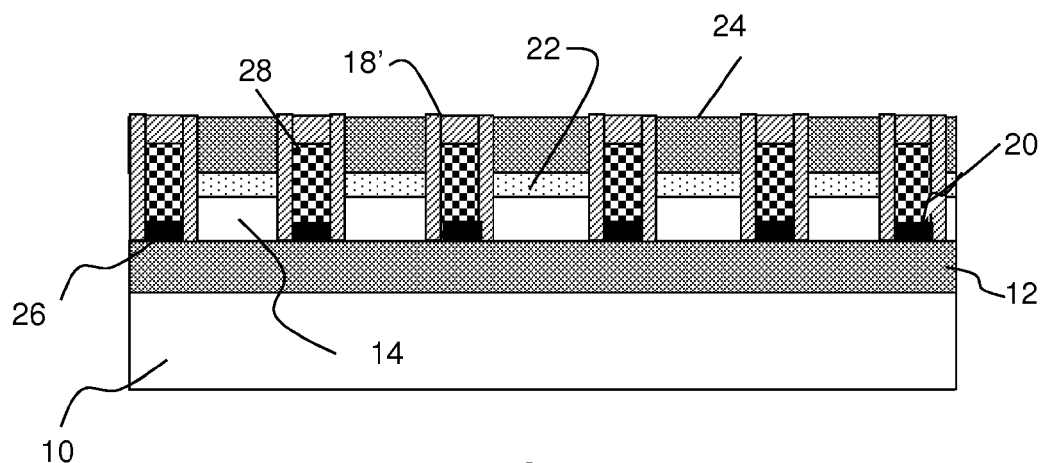
Figure 5B:
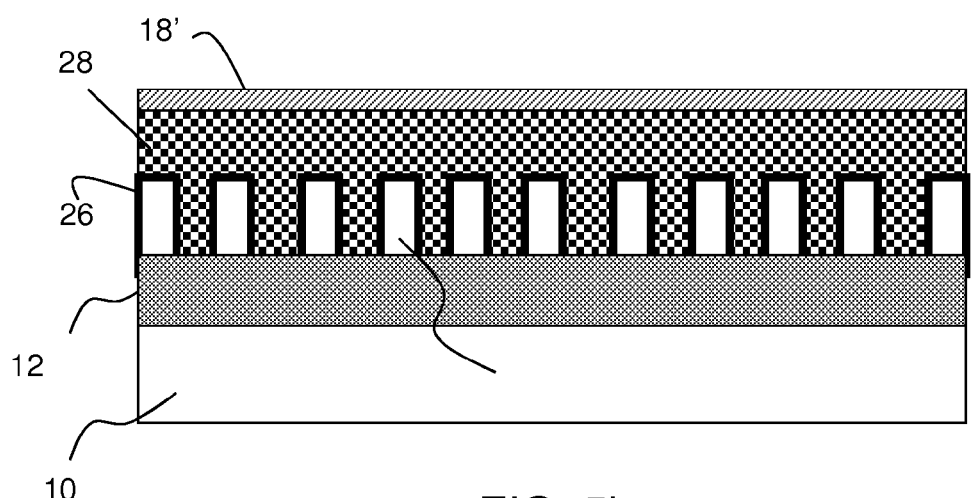

FIGS. 5a and 5b show different cross-sectional views of a structure and respective manufacturing processes, in accordance with aspects of the present invention. In particular, FIGS. 5a and 5b show a replacement gate process in accordance with aspects of the present invention. The replacement gate process includes the removal of the dummy structure and hardmask material using conventional etching processes. In embodiments, the dummy structure and hardmask material can be removed in separate etching steps, reactive to each material. In accordance with aspects of the present invention, a mask is not required to remove these materials.

After removal of the dummy structure and hardmask material, a gate dielectric material 26 is deposited between the spacers 20. In embodiments, the gate dielectric material 26 can be a high-k material such as a hafnium based material. A workfunction metal and gate material (e.g., poly, metal or metal alloys or combinations thereof known to those of skill in the art) are deposited on the gate dielectric material 26 to form the gate structure 28. The gate structure 28 can be slightly recessed, and a capping material 18' formed thereon. In embodiments, the capping material 18' can be a nitride material, deposited to a thickness of about 20 nm; although other dimensions are also contemplated by the present invention. The capping material 18' is planarized to the surface of the dielectric layer 24 using, for example, a CMP process.

Figure 6:
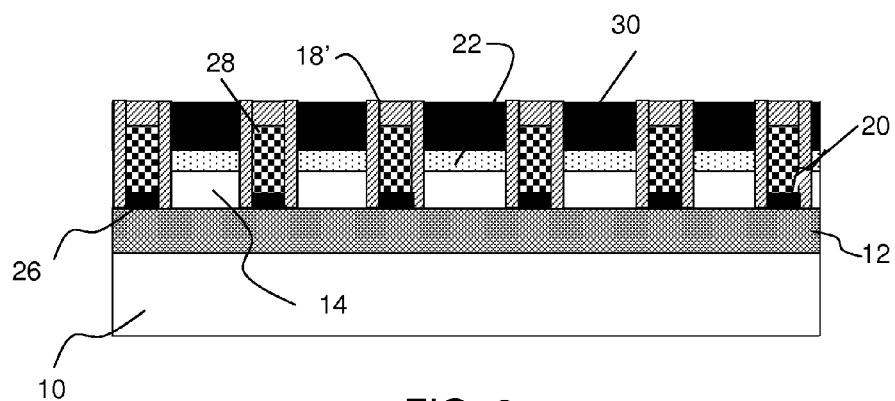

In FIG. 6, the dielectric layer (dielectric layer 24 shown in FIG. 5a) is removed (exposing the epitaxial layer 22), using conventional etching processes. In accordance with aspects of the present invention, a mask is not required to remove this material. A metal material 30 is then deposited on the epitaxial layer 22. In embodiments, the metal material 30 can include, for example, a Ti liner and a tungsten material. The Ti liner can be deposited to a depth of about 5 nm; although other dimensions are also contemplated by the present invention. The Ti liner can be formed by a metal sputter or CVD process, and the tungsten material can be formed by a CVD process. The metal material 30 can be planarized using a CMP process, e.g., planar with the capping material 18'.

Figure 7:
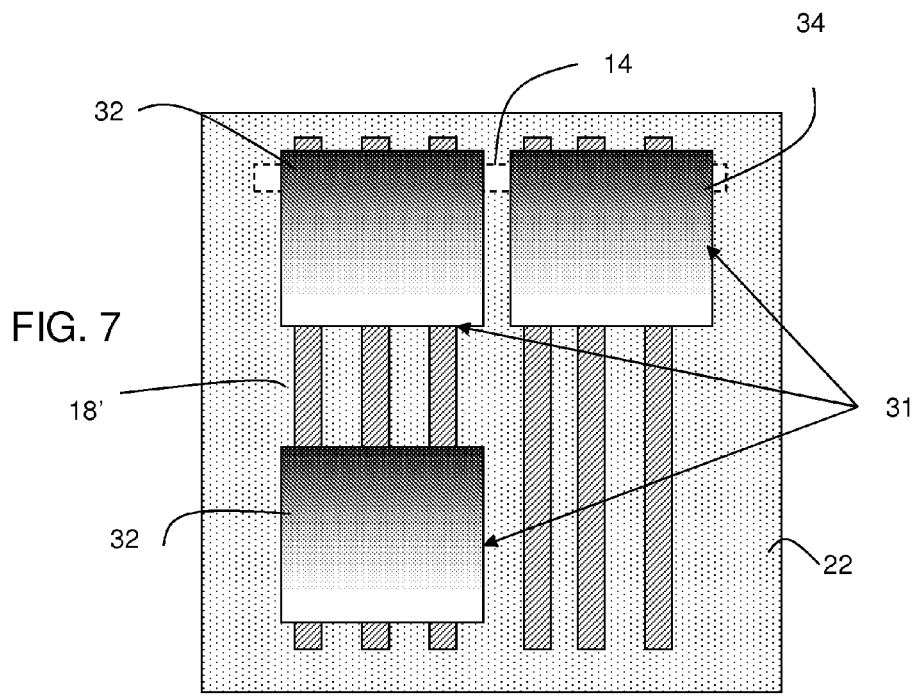

In FIG. 7, active areas 32 and 34 are initially defined using conventional lithography processes. For example, to define the active areas 32 and 34, a resist material 31 is formed on exposed surfaces of the metal material 30 and capping material 18'. The resist 31 is then patterned, e.g., exposed to energy, to expose portions of the nitride capping material 18' and metal material 30, the latter of which is subsequently removed in an etching process performed through the pattern of the resist. The nitride capping material 18' will protect the portions of the active areas 32 and 34, in subsequent processing steps. In this lithography step, the active areas 32 and 34 are self aligned with the contacts, e.g., metal material 30, in a direction parallel to the at least one gate structure. As should also be understood by those of skill in the art, the metal material 30 acts as contacts to the source and drain regions.

Figure 8:
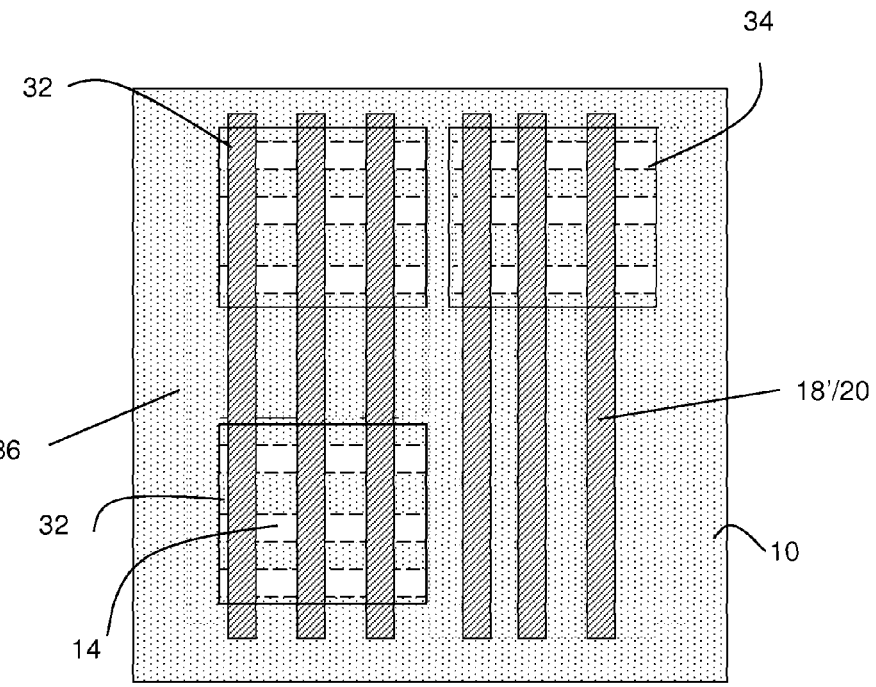

In FIG. 8, the active areas 32 and 34 are further defined by an etching process, e.g., which is subsequently used to form shallow trench isolation (STI) structures. In embodiments, to form the active areas 32 and 34, an etching process if performed on any exposed portions of the metal material 30, e.g., tungsten and Ti, selective to the nitride spacer 20 and capping material 18'. In embodiments, the etching process will remove any exposed metal material 30, epitaxial layer 22, portions of the fins 14 and the dielectric layer 12. This etching process can be both a dry and/or wet etching process, to form trenches 38 extending to the substrate 10. In embodiments, the selectively can be about 1:8.

Figure 9:
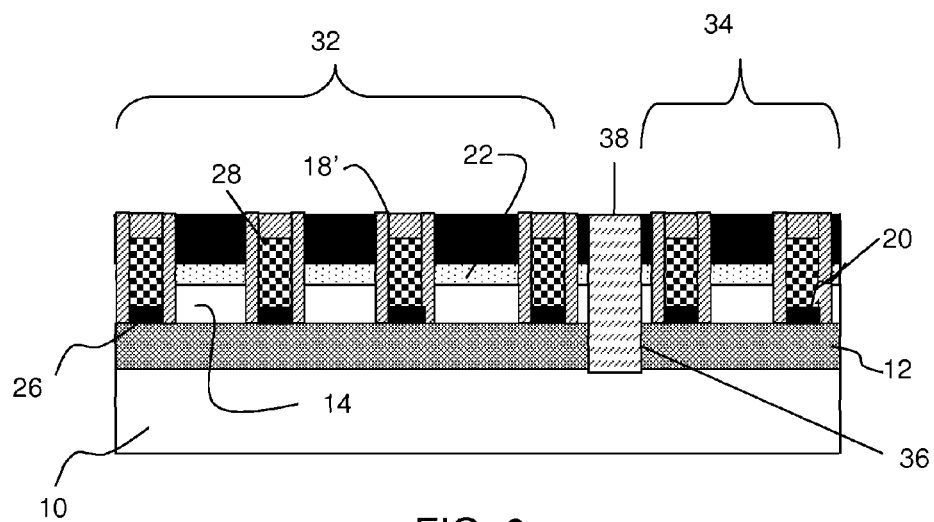

As shown in FIG. 9, an oxide or nitride material is then deposited within the trenches 36 to form STI structures 38 between the active areas 32, 34. In embodiments, the STI structures 38 extend to the substrate 10, e.g., formed within the metal material 30, epitaxial layer 22, portions of the fins 12 and the dielectric layer 14. After deposition of the oxide material, any residual oxide material can be removed using a CMP process.

Figure 10A:
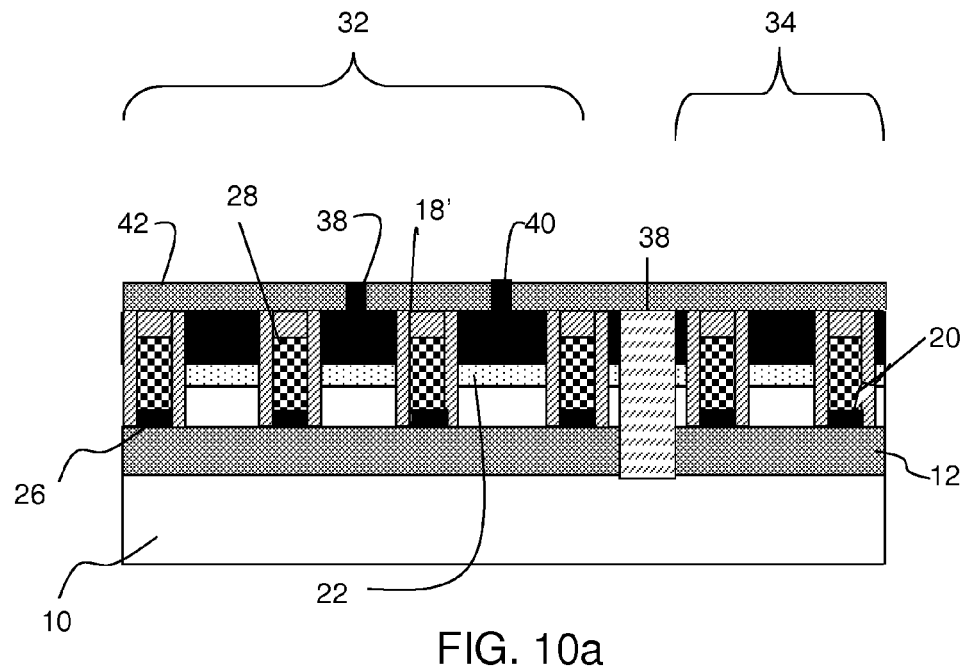
Figure 10B:
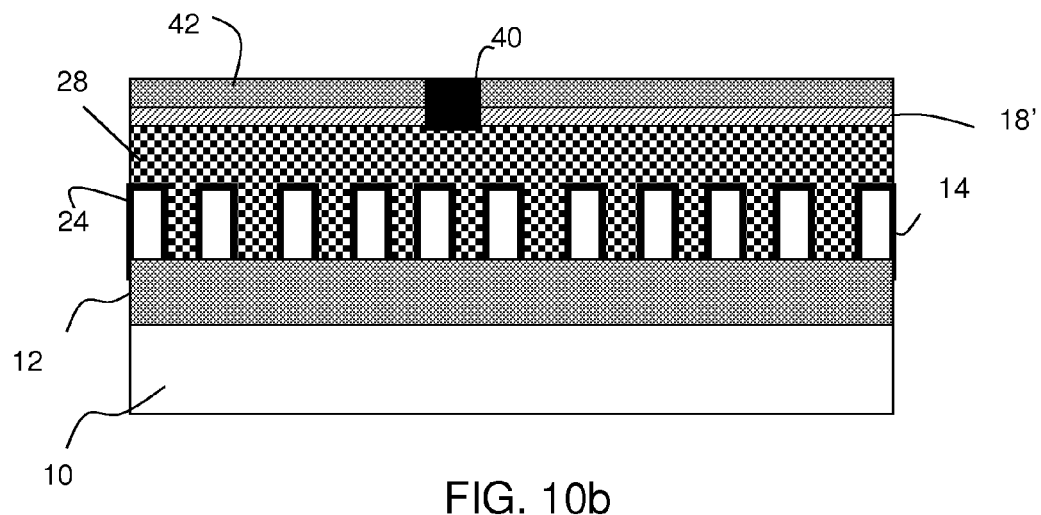

FIGS. 10*a* and 10*b* show different cross-sectional views of a structure and respective manufacturing processes, in accordance with aspects of the present invention. In particular, FIGS. 10*a* and 10*b* show back end of the line (BEOL) process, including the formation of gate contacts 40, formed within a dielectric material 42. More specifically, a dielectric material 42 is blanket deposited on the structure of FIG. 9. One or more contact studs 40 are formed within the dielectric material 42 by lithography, etching and deposition processes, known to those of skill in the art. In embodiments, the contact studs 40 can be formed by the deposition of tungsten or, more preferably, copper. In embodiments, the deposition process can be a CVD, followed by a CMP process to remove any excess material. In embodiments, the contact studs 40 will extend to source and drains, as well as the gate, itself.

Figure 11:
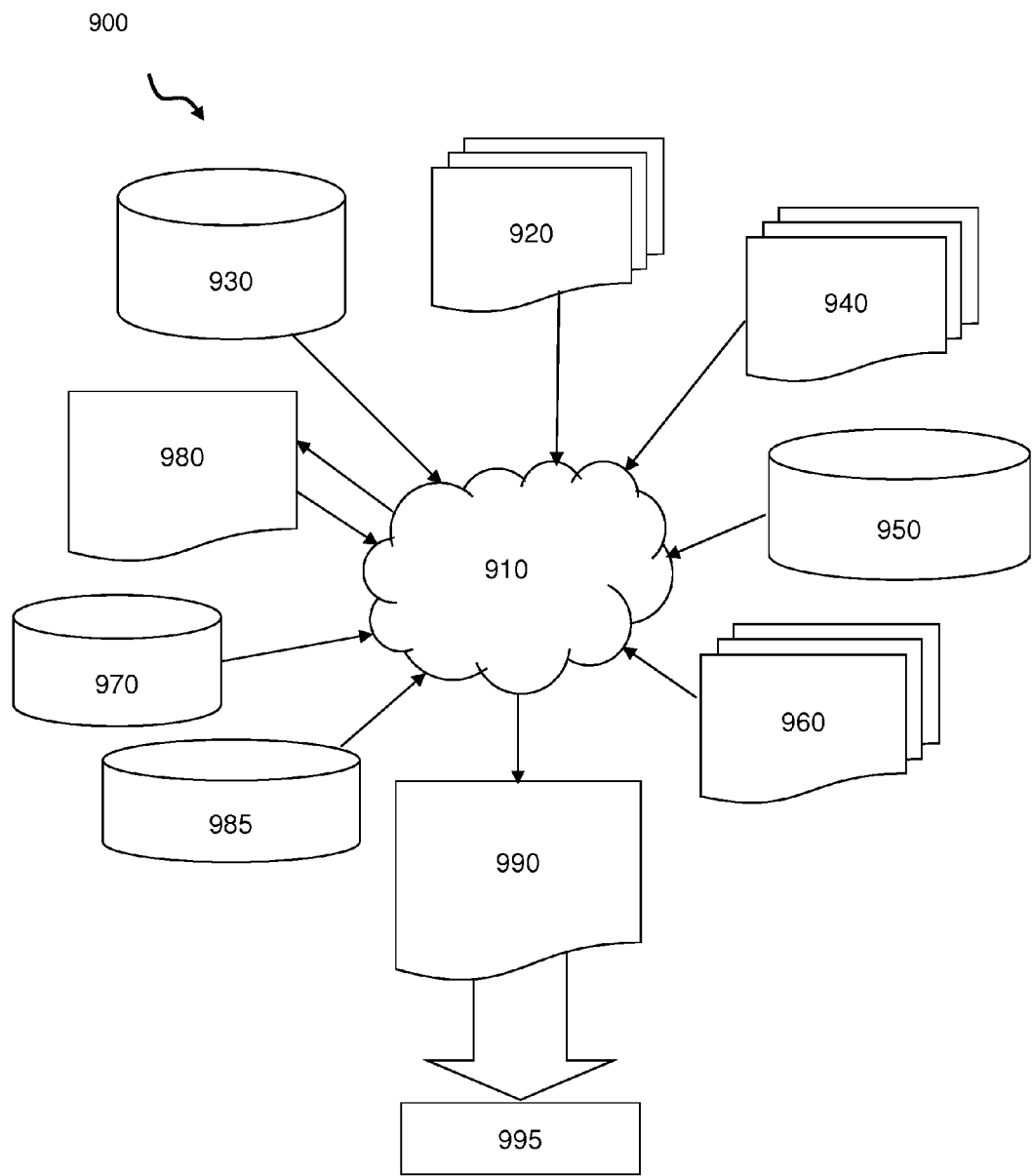
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 2*a*, 2*b*, 3-5*a*, 5*b*, 6-10*a* and 10*b*. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2*a*, 2*b*, 3-5*a*, 5*b*, 6-10*a* and 10*b*. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2*a*, 2*b*, 3-5*a*, 5*b*, 6-10*a* and 10*b* to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2a, 2b, 3-5a, 5b, 6-10a and 10b. In one embodiment, design structure 990 may comprise a compiled, executable HDL simulation model that functionally simulates the devices shown in FIGS. 1, 2a, 2b, 3-5a, 5b, 6-10a and 10b.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2a, 2b, 3-5a, 5b, 6-10a and 10b. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    forming at least one gate structure over a plurality of fin structures;
    removing dielectric material adjacent to the at least one gate structure using a maskless process, thereby exposing an underlying epitaxial layer formed adjacent to the at least one gate structure;
    depositing metal material on the exposed underlying epitaxial layer to form contact metal in electrical contact with source and drain regions, adjacent to the at least one gate structure;
    forming active areas and device isolation after the formation of the contact metal, comprising the at least one gate structure,
    wherein the active areas and the contact metal are self-aligned with each other in a direction parallel to the at least one gate structure.

2. The method of claim 1, wherein the forming of the at least one gate structure is a replacement gate process.

3. The method of claim 2, wherein the replacement gate process comprises:
    forming a dummy gate structure over the plurality of fin structures, comprising:
        depositing a poly material on the plurality of fin structures and underlying dielectric material;
        depositing a capping material on the poly material;
        patterning the poly material and the capping material; and
        forming sidewall spacers on sidewalls of the patterned poly material, extending to the capping material;
    depositing the dielectric material adjacent to the sidewall spacers and on the underlying epitaxial layer;
    removing the poly material and the capping material between the sidewall spacers, exposing portions of the plurality of the fins and the underlying dielectric material;
    depositing gate dielectric material on the exposed portions of the plurality of the fins and the underlying dielectric material;
    depositing gate material on the gate dielectric material; and
    depositing a second capping material on the gate material.

4. The method of claim 3, wherein the dummy gate structure is removed in a maskless process.

5. The method of claim 3, wherein the second capping material is formed by deposition of nitride material.

6. The method of claim 3, wherein the forming of the underlying epitaxial layer is a growth process, grown on the exposed portions of the plurality of the fins.

7. The method of claim 3, wherein the underlying epitaxial layer is formed after the formation of the sidewall spacers and prior to the depositing of the gate dielectric material.

8. The method of claim 3, wherein the underlying epitaxial layer is a doped material which forms the source and drain regions of the at least one gate structure.

9. The method of claim 8, further comprising forming of contact studs which comprises:
  depositing an insulator layer on the metal material;
  patterning the insulator layer to form openings which expose portions of the metal material; and
  depositing metal in the openings to electrically contact with the source and drain regions of the at least one gate structure through the metal material.

10. The method of claim 3, wherein the forming of the active areas comprises:
  patterning a resist formed on the second capping material and metal material; and
  removing exposed portions of the metal material and underlying material to a substrate, selective to the second capping material, thereby forming a trench structure.

11. The method of claim 10, further comprising separating the active areas with a shallow trench isolation structure formed within the trench structure.

12. The method of claim 1, wherein the second capping material is a nitride material.

13. The method of claim 1, wherein the metal material is a Ti liner and tungsten material.

14. The method of claim 1, further comprising depositing a capping material on the at least one gate structure, and wherein the forming of the active areas comprises:
  patterning a resist formed on the capping material and metal material; and
  removing exposed portions of the metal material and underlying material to a substrate, selective to the capping material, thereby forming a trench structure.

15. A method, comprising:
  forming at least one replacement gate structure extending over a plurality of fin structures and surrounded by dielectric material;
  removing the dielectric material using a maskless process, thereby exposing an underlying epitaxial layer formed adjacent to the at least one replacement gate structure;
  depositing metal material on the exposed underlying epitaxial layer, adjacent to the at least one replacement gate structure;
  forming active areas, after the formation of the metal material, comprising the at least one replacement gate structure; and
  forming contact studs contacting the metal material and electrically connected to source and drain regions of the least one replacement gate structure.

16. The method of claim 15, wherein the at least one replacement gate structure is formed with a replacement gate process comprising:
  depositing a poly material on the plurality of fin structures and underlying dielectric material;
  depositing a capping material on the poly material;
  patterning the poly material and the capping material;
  forming sidewall spacers on sidewalls of the patterned poly material;
  depositing the dielectric material adjacent to the sidewall spacers;
  removing the poly material and the capping material between the sidewall spacers, exposing portions of the plurality of the fins and the underlying dielectric material;
  depositing gate dielectric material on the exposed portions of the plurality of the fins and the underlying dielectric material;
  depositing gate material on the gate dielectric material; and
  depositing a second capping material on the gate material.

17. The method of claim 16, wherein:
  the second capping material is formed by deposition of nitride material;
  the underlying epitaxial layer is formed by growing doped Si material on the exposed portions of the plurality of the fins; and
  the underlying epitaxial layer is formed after the formation of the sidewall spacers and prior to the depositing of the gate dielectric material.

18. The method of claim 17, wherein the forming of the contact studs comprises:
  depositing an insulator layer on the metal material and second capping material;
  patterning the insulator layer to form openings which expose portions of the metal material; and
  depositing metal in the openings to electrically contact with the source and drain regions of the at least one gate structure through the metal material.

19. The method of claim 17, wherein the forming of the active areas comprises:
  patterning a resist formed on the second capping material and metal material; and
  removing exposed portions of the metal material and underlying material to a substrate, selective to the capping material, thereby forming a trench structure.

20. The method of claim 19, further comprising separating the active areas with a shallow trench isolation structure formed within the trench structure, wherein the second capping material is a nitride material which protects the at least one replacement gate structure, and the metal material is a Ti liner and tungsten material.

21. The method of claim 15, further comprising depositing a capping material on the at least one gate structure, and wherein the forming of the active areas comprises:
  patterning a resist formed on the capping material and metal material; and
  removing exposed portions of the metal material and underlying material to a substrate, selective to the capping material, thereby forming a trench structure.

* * * * *